US009459335B2

(12) United States Patent
Riederer et al.

(10) Patent No.: US 9,459,335 B2
(45) Date of Patent: Oct. 4, 2016

(54) SYSTEM AND METHOD FOR PARALLEL MAGNETIC RESONANCE IMAGING WITH OPTIMALLY SELECTED IN-PLANE ACCELERATION

(71) Applicants: Stephen J Riederer, Rochester, MN (US); Paul T Weavers, Rochester, MN (US)

(72) Inventors: Stephen J Riederer, Rochester, MN (US); Paul T Weavers, Rochester, MN (US)

(73) Assignee: Mayo Foundation For Medical Education and Reseach, Rochester, MN (US)

( * ) Notice: Subject to any disclaimer, the term of this patent is extended or adjusted under 35 U.S.C. 154(b) by 592 days.

(21) Appl. No.: 14/025,983

(22) Filed: Sep. 13, 2013

(65) Prior Publication Data
US 2014/0077801 A1    Mar. 20, 2014

Related U.S. Application Data

(60) Provisional application No. 61/701,112, filed on Sep. 14, 2012.

(51) Int. Cl.
*G01V 3/00* (2006.01)
*G01R 33/56* (2006.01)
*G01R 33/48* (2006.01)
*G01R 33/561* (2006.01)

(52) U.S. Cl.
CPC .......... *G01R 33/56* (2013.01); *G01R 33/4822* (2013.01); *G01R 33/5611* (2013.01)

(58) Field of Classification Search
CPC ................................... G01R 33/4822
USPC ................. 324/309, 307, 306, 314
See application file for complete search history.

(56) References Cited

U.S. PATENT DOCUMENTS

| | | | |
|---|---|---|---|
| 6,992,485 B2 | 1/2006 | Campagna et al. | |
| 2015/0212177 A1* | 7/2015 | Ahmad | G01R 33/4818 324/309 |
| 2015/0316630 A1* | 11/2015 | Zhao | G01R 33/4818 324/309 |
| 2015/0346305 A1* | 12/2015 | King | G01R 33/5611 324/309 |
| 2016/0041247 A1* | 2/2016 | Feiweier | A61B 5/055 324/309 |
| 2016/0054418 A1* | 2/2016 | Doneva | G01R 33/4818 324/309 |

OTHER PUBLICATIONS

Griswold, et al., Generalized Autocalibrating Partially Parallel Acquisitions (GRAPPA), Magnetic Resonance in Medicine, 2002, 47:1202-1210.
Pruessmann, et al., SENSE: Sensitivity Encoding for Fast MRI, Magnetic Resonance in Medicine, 1999, 42:952-962.
Sodickson, et al., Simultaneous Acquisition of Spatial Harmonics (SMASH): Fast Imaging with Radiofrequency Coil Arrays, Magnetic Resonance in Medicine, 1997, 38:591-603.
Weiger, et al., 2D Sense for Faster 3D MRI, Magnetic Resonance Materials in Physics, Biology and Medicine, 2002, 14:10-19.

* cited by examiner

*Primary Examiner* — Louis Arana
(74) *Attorney, Agent, or Firm* — Quarles & Brady LLP

(57) ABSTRACT

A method for three-dimensional parallel magnetic resonance imaging (MRI) using an MRI system is provided. The method includes determining in-plane acceleration factors that optimize a selected criterion, such as an image quality criterion defined by maximal noise amplification in a reconstructed image. The estimated in-plane acceleration factors are used to establish a k-space sampling pattern, which is used to acquire k-space data. An image is reconstructed from the acquired k-space data using a parallel image reconstruction technique.

19 Claims, 5 Drawing Sheets

SYSTEM AND METHOD FOR PARALLEL MAGNETIC RESONANCE IMAGING WITH OPTIMALLY SELECTED IN-PLANE ACCELERATION

CROSS-REFERENCE TO RELATED APPLICATIONS

This application claims the benefit of U.S. Provisional Patent Application Ser. No. 61/701,112 filed on Sep. 14, 2012, and entitled "SYSTEM AND METHOD FOR PARALLEL MAGNETIC RESONANCE IMAGING WITH OPTIMALLY SELECTED IN-PLANE ACCELERATION."

STATEMENT REGARDING FEDERALLY SPONSORED RESEARCH

This invention was made with government support under HL070620 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for image reconstruction using parallel MRI techniques.

Methods for acceleration of magnetic resonance image acquisition were introduced about a decade ago. Broadly stated, these are techniques which allow for the number of phase encoding measurements or "views" necessary for MR image formation to be reduced compared to some reference number. This is done by sampling along the phase encoding direction more coarsely than is normally required to generate an image with a given field-of-view ("FOV") and spatial resolution. The undersampling is accounted for in some manner by using measurements from multiple receiver coils. There are two classes of acceleration techniques: those based in k-space and those based in image-space.

Techniques based in k-space include SMASH and GRAPPA. For view locations at which measurements are not made directly, measurements at those locations are estimated using actual measurements made at nearby view locations in k-space. The estimation function or "kernel" used is itself created from fully sampled acquisition performed at and about the k-space origin. This is called the "training region." The fully sampled data in the training region are used to model how measurements at target view locations can be estimated from nearby views for which the data are measured. With k-space-based methods the degree of undersampling that is typically done is an integer. That is, away from the fully sampled training region only every other or every third or fourth view is actually measured. This results in a nominal acceleration, R, which is constrained to being an integer: R=2, 3, 4, etc. Because the training region is fully sampled, the nominal acceleration is not attained over the entirety of k-space. Consequently, the net acceleration is reduced somewhat, typically 10% to 20%, from the nominal.

Image-based acceleration is performed differently. In any MRI acquisition the increment $\Delta k$ between sampled positions along a direction in k-space is established by the FOV along that direction in an inverse relationship: $\Delta k=1/FOV$. For standard, non-accelerated acquisition the FOV used is set to comfortably encompass the object. For image-based acceleration methods the k-space sampling interval is intentionally chosen as if the FOV were smaller than the object dimension by the acceleration factor, R. Due to the inverse relationship this causes the k-space increment to be larger than normal. This in turn allows the time required to sample out to some maximum k-value to be reduced because the increment is larger. However, the reduced field-of-view, FOV/R, causes foldover or aliasing of the image onto itself. Using data acquired simultaneously from multiple receiver coils, the aliased images from the multiple coils can be algebraically unfolded into a normal-appearing unaliased image.

The use of acceleration methods to reduce the acquisition time for a given spatial resolution carries with it a penalty, the penalty being a reduction in the signal-to-noise ratio (SNR) of the accelerated image vs. that in an unaccelerated reference image. In general, as acceleration R is increased, the SNR decreases. The degree of SNR penalty is related to the interplay of the spatial response functions or "sensitivity maps" of the individual receiver coils across the object. These sensitivity maps are generally measured as part of the process of performing accelerated acquisition. Importantly, the degree of SNR loss in the accelerated image can be calculated from the sensitivity maps. This calculation results in what is called the "g-factor." That is, it is not necessary to perform an accelerated scan to determine what the relative SNR loss is in the images formed from that scan.

An aspect of image-based acceleration relevant to this disclosure is that the k-space increment need not be an integer multiple of the standard increment 1/FOV. That is, $\Delta k=R/FOV$, where R can be an arbitrary number larger than unity. Equivalently, the FOV can be progressively reduced from its starting value, and with greater reduction the degree of aliasing increases. This can be valuable in image-based vs. k-space-based acceleration. For k-space-based methods if, for example, the SNR loss with a nominal acceleration of R=2 is acceptable but for R=3 it is unacceptable, then it would be necessary to use R=2. However, for the image-based approach although R=3 may be unacceptable, it is possible that R=2.8, for example, would still have adequate SNR, thereby allowing an acceleration 2.8/2.0 or 40% higher than that allowed with the k-space-based approach.

In image-based acceleration it is useful to know if specific regions within the full, unreduced FOV are known to have zero signal. Such regions occur, for example, in the air outside the object but still within the square or rectangular FOV used in image acquisition. From this information one can force the signal in these regions to be zero in the unfolding process. This then reduces the uncertainty in the unfolding process, for example by preventing measured aliased signal from being assigned to points known to have zero signal. This process of identifying regions within the FOV but outside the object and known to have zero signal is called "masking."

The discussion thus far about acceleration has made no distinction as to how many directions the acceleration is being performed along. For 2DFT image acquisition, acceleration R can be done along the one phase encoding direction, Y. For 3DFT acquisition, it is possible to perform acceleration separately along two phase encoding directions, Y and Z. The respective accelerations can be called RY and RZ. The overall acceleration R is equal to the product of the individual Y and Z accelerations, R=RY×RZ.

SUMMARY OF THE INVENTION

The present invention overcomes the aforementioned drawbacks by providing a method for three-dimensional parallel magnetic resonance imaging (MRI) using an MRI system. The method includes selecting a criterion, such as an image quality criterion. Coil sensitivity maps are acquired using the MRI system. An acceleration factor along a first phase-encoding direction and an acceleration factor along a second phase-encoding direction are determined, such that the product of the two is substantially equal to a desired net acceleration factor and such that the selected criterion is optimized. A k-space sampling pattern is generated using the estimated acceleration factors, and k-space data is acquired using the MRI system to sample k-space in accordance with the generated k-space sampling pattern. An image is reconstructed from the acquired k-space data using, for example, a parallel image reconstruction technique.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Acceleration apportionment is a method for providing optimized acceleration for magnetic resonance imaging ("MRI"). Using the information obtained from preliminary scout images, the specific acceleration values are determined which provide optimum performance in a subsequent MRI scan done using parallel acquisition. This can be done on a patient-specific and anatomy-specific basis. The associated penalty with the optimization technique is insignificant. There is no additional scanning, as the preliminary scout images are already acquired for coil sensitivity maps. The computation time necessary for determining the optimum acceleration values is small enough—on the order of a few seconds—that it can be easily included within a standard MRI examination.

Data acquisition for MR image formation is conveniently described as being performed in k-space, the reciprocal space for image space as defined by the Fourier transformation. For a three-dimensional Fourier transform ("3DFT") acquisition, the final image is a function of the three spatial variables (X,Y,Z), which are reciprocal with the k-space variables ($k_X,k_Y,k_Z$). By way of example, the $k_X$-direction is assumed to correspond to the frequency-encoding or readout direction, and thus the two phase-encoding directions are $k_Y$ and $k_Z$. It will be appreciated by those skilled in the art, however, that the selection of frequency-encoding and phase-encoding directions can readily be changed. In this example, every repetition within a 3DFT acquisition corresponds to the sampling of a specific point in k-space, ($k_Y,k_Z$), with samples made over the measured signal for that repetition corresponding to points along the $k_X$-direction. It is convenient to represent the sampling for 3DFT acquisition as sampling k-space at points lying in the $k_Y$-$k_Z$ plane along the $k_X$-direction.

For non-accelerated 3DFT acquisitions, the spacing of samples along the $k_Y$ and $k_Z$ directions is reciprocal with the corresponding field-of-view ("FOV"), which is expressed in units of distance, typically centimeters. That is, $$\Delta k_Y = \frac{1}{FOV_Y}; \qquad (1)$$

$$\Delta k_Z = \frac{1}{FOV_Z}. \qquad (2)$$

Figure 1A:
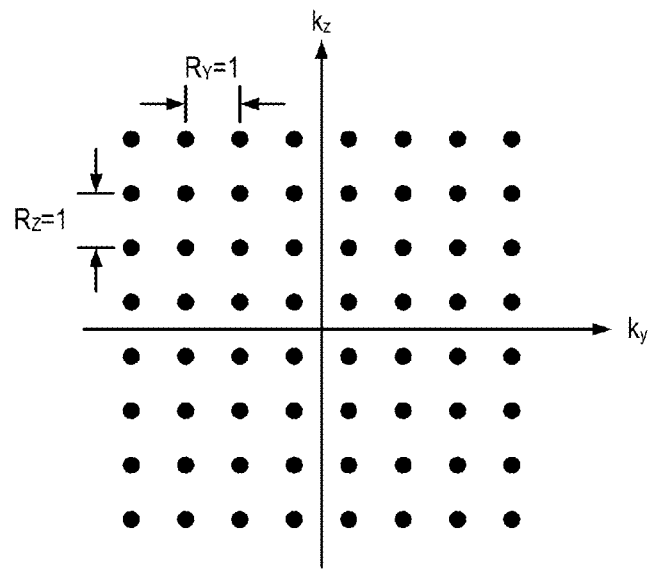
FIG. 1A is an example Cartesian grid of k-space sample points in the ky-kz plane with R=1.

An example of a traditional sampling of the $k_Y$-$k_Z$ plane during a 3DFT acquisition is illustrated in FIG. 1A. For simplicity, it is assumed that the fields-of-view along the Y-direction and the Z-direction are the same; thus, it is also assumed that the sampling intervals along the $k_Y$-direction and the $k_Z$-direction are identical.

As described previously, when a parallel acquisition is performed using an image-based approach, such as SENSE, the spacing between k-space samples is increased. The net acceleration, R, is the product of the individual accelerations $R_Y$ and $R_Z$ used along the Y-direction and the Z-direction, respectively. That is, $$R=R_Y \cdot R_Z \qquad (3);$$

where the modified sample spacings in k-space are given by, $$\Delta k'_Y = \frac{R_Y}{FOV_Y} = R_Y \Delta k_Y; \qquad (4)$$

$$\Delta k'_Z = \frac{R_Z}{FOV_Z} = R_Z \Delta k_Z. \qquad (5)$$

Figure 1B:
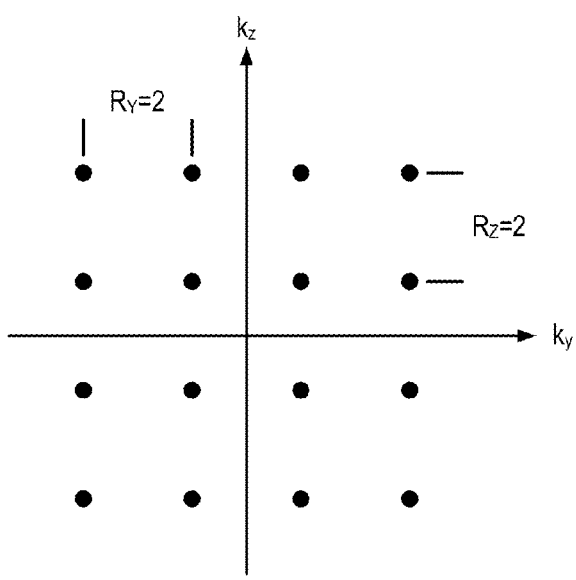
FIG. 1B is an example Cartesian grid of k-space sample points in the ky-kz plane with R=4, Ry=2, and Rz=2.

An example of an undersampled sampling of the $k_Y$-$k_Z$ plane during a 3DFT acquisition is illustrated in FIG. 1B. In this example, $R_Y$=2 and $R_Z$=2; thus, the net acceleration of this acquisition is R=4.

The method of the present invention recognizes that a given overall acceleration factor, R, can be expressed as the product of a variety of combinations of the individual accelerations $R_Y$ and $R_Z$. Furthermore, it is recognized that an optimization process can be applied to select optimal candidates for $R_Y$ and $R_Z$. That is, $R_Y$ and $R_Z$ can be selected to provide a target acceleration factor, R, but subject to optimizing some performance metric. As an example, for a given acceleration factor, R, the specific combination of $R_Y$ and $R_Z$ may be chosen to provide the smallest maximum noise amplification over the three-dimensional FOV of the MRI acquisition. In this example, the noise amplification may be defined as the g-factor of the SENSE reconstruction. The set of all possible $R_Y$ and $R_Z$ combinations subject to the criterion that their product results in a desired net acceleration factor, R, would then be analyzed, and the maximum g-factor determined for each pair of $R_Y$ and $R_Z$. The pair providing the smallest maximum noise amplification would then be selected and used in a SENSE-accelerated MRI acquisition.

Figure 1C:
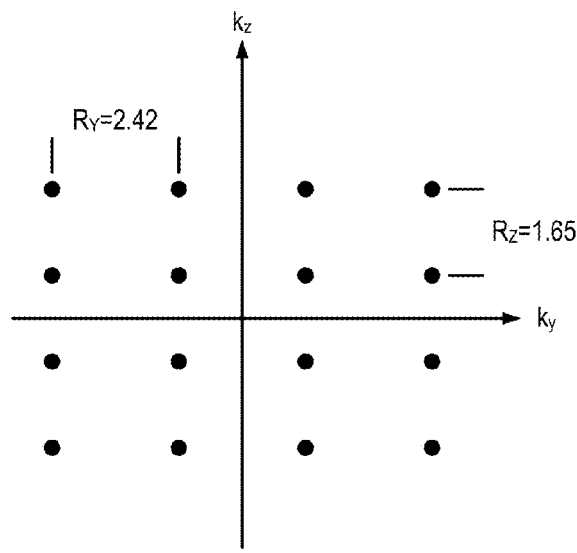
FIG. 1C is an example Cartesian grid of k-space sample points in the ky-kz plane with R=4, Ry=2.42, and Rz=1.65.

In the above example, suppose that the combination selected is $(R_Y, R_Z) = (2.42, 1.65)$. These values would be inserted into the pulse sequence that controls the subsequent accelerated MRI acquisition. Based on the relationships in Eqns. (4) and (5), this will result in a modified k-space sampling pattern with the appropriate spacing between sample points. This is shown schematically in FIG. 1C. An acquisition performed using this sampling pattern would be assured to achieve an acceleration factor of R=4 while providing the smallest maximum noise amplification over the imaging volume.

Figure 2:
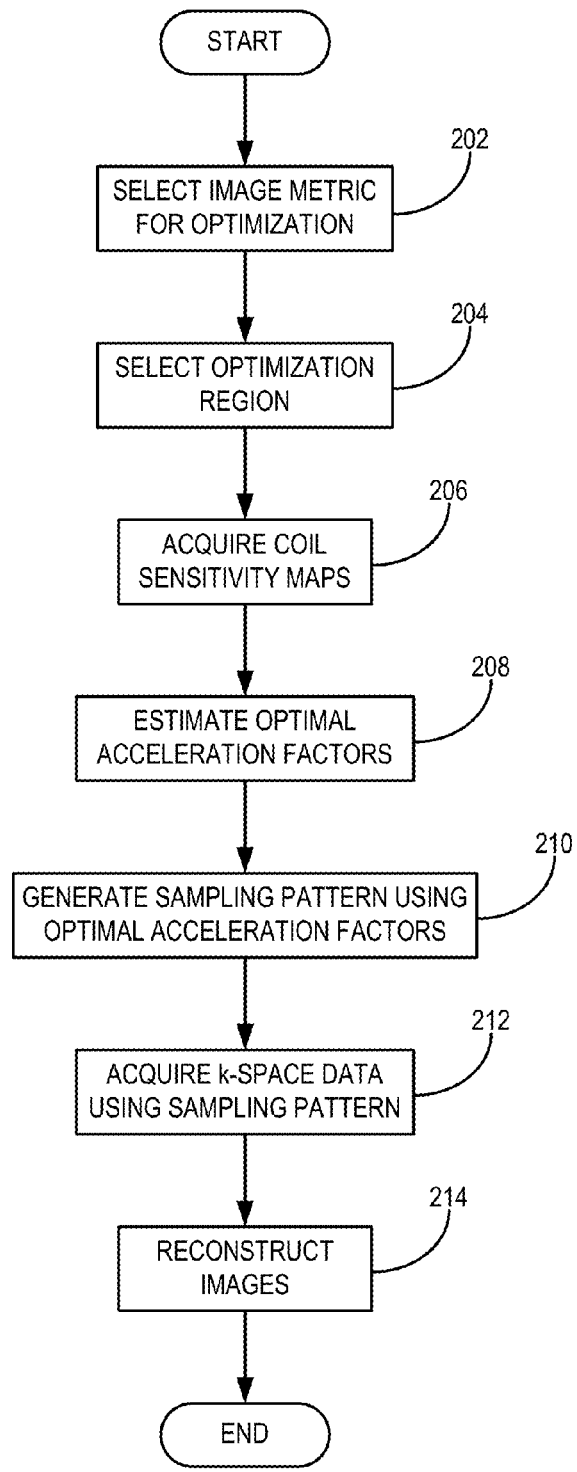
FIG. 2 is a flowchart setting forth the steps of an example of a method for selecting in-plane acceleration factors and reconstructing images acquired from k-space data acquired in accordance with the in-plane acceleration factors.

Referring now to FIG. 2, a flowchart setting forth the steps of a method for generating a k-space sampling pattern to be used in a parallel MRI acquisition is illustrated. The method begins with selecting a criterion that will be used to select the optimal in-plane acceleration factors, $R_1$ and $R_2$, as indicated at step 202. Here, $R_1$ is an in-plane acceleration factor along a first in-plane direction and $R_2$ is an in-plane acceleration factor along a second in-plane direction. For example, $R_1 = R_Y$ and $R_2 = R_Z$. In general, this criterion will be related to an aspect of the quality of the accelerated image, and should be a criterion that can be calculated or estimated using a mathematically well-defined, computable parameter or metric. For example, the criterion may be related by a metric such as a maximum noise amplification. Next, a region in $(R_1, R_2)$-space within which the optimal combination of in-plane acceleration factors is expected to lie is selected, as indicated at step 204.

Having selected the criterion to evaluate the optimality of the in-plane acceleration factors and the region in $(R_1, R_2)$-space to search for those acceleration factors, the method proceeds with the acquisition of coil sensitivity maps, as indicated at step 206. These coil sensitivity maps that will be analyzed to determine the in-plane acceleration factors that optimize the selected criterion, in addition to being used for reconstruction of images using a parallel image reconstruction technique, such as SENSE. Next, the in-plane acceleration factors that optimize the selected criterion are estimated, as indicated at step 208.

Figure 3:
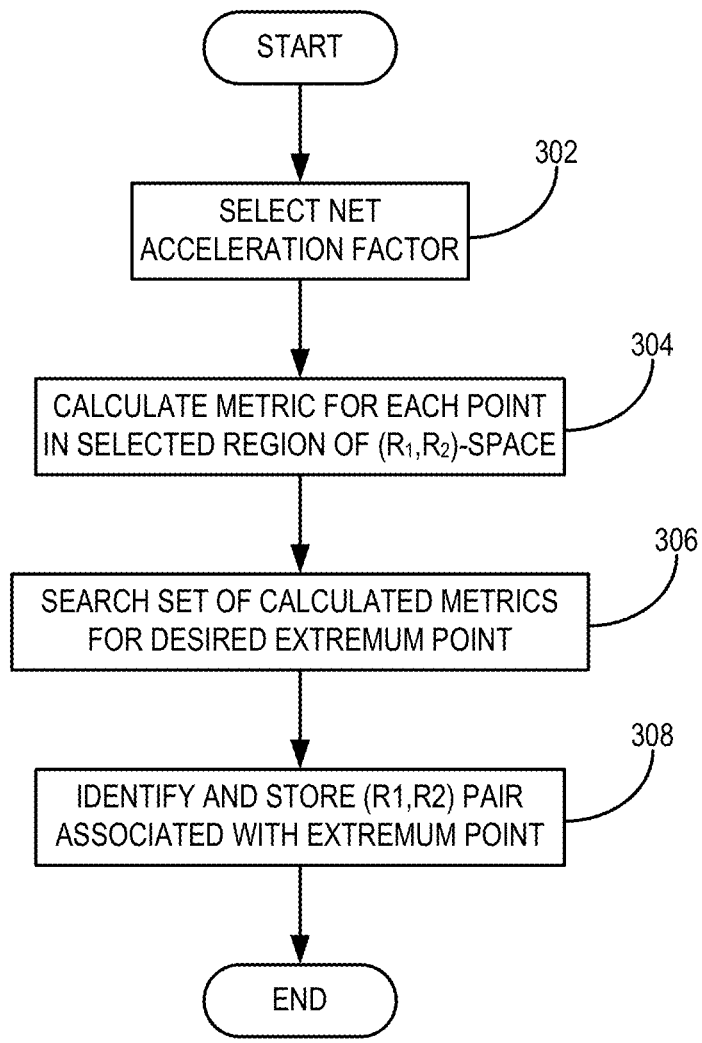
FIG. 3 is a flowchart setting forth the steps of an example of a method for determining in-plane acceleration factors that optimize a desired criterion.

The estimation of the optimal in-plane acceleration factors proceeds as follows, and as illustrated in the flowchart shown in FIG. 3. The optimization is typically performed using images of the three-dimensional imaging volume over which the accelerated scan is to be performed. Conveniently, the coil sensitivity maps are such images. In other embodiments, other images of the three-dimensional imaging volume may also be provided; however, the coil sensitivity maps generally suffice and do not require the performance of an additional imaging scan. By way of example, the noise amplification embodied by the g-factor mentioned above can be computed directly from the coil sensitivity maps.

First, the desired net acceleration factor, $R = R_1 \cdot R_2$, is selected, as indicated at step 302. Then, an optimization process that estimates the combination of in-plane acceleration factors that results in the optimal criterion is performed. This optimization is constrained, in part, by the selected net acceleration factor, R. That is, only pairs of in-plane acceleration factors $(R_1, R_2)$ that satisfy the relationship $R = R_1 \cdot R_2$ will be considered. It is noted, however, that while the optimization is constrained to achieve a net acceleration factor, the product $R_1 \cdot R_2$ does not need to exactly equal the desired net acceleration factor, R, but may be within an appropriate amount of variation of this value.

The optimization process includes searching for the combination of in-plane acceleration factors that maximizes or minimizes the selected criterion. This search includes calculating the parameter or metric related to the selected optimization criterion for each point in the selected region of $(R_1, R_2)$-space, as indicated at step 304. Once the parameter or metric has been calculated for each point in the selected region of $(R_1, R_2)$-space, the set of all the calculated values for the parameter or metric is searched for the maximum or minimum value, depending on the optimization criterion, as indicated at step 306. After the maximum or minimum value is identified, the related $(R_1, R_2)$ pair is selected as the in-plane acceleration factors to be used for data acquisition, as indicated at step 308.

Figure 4:
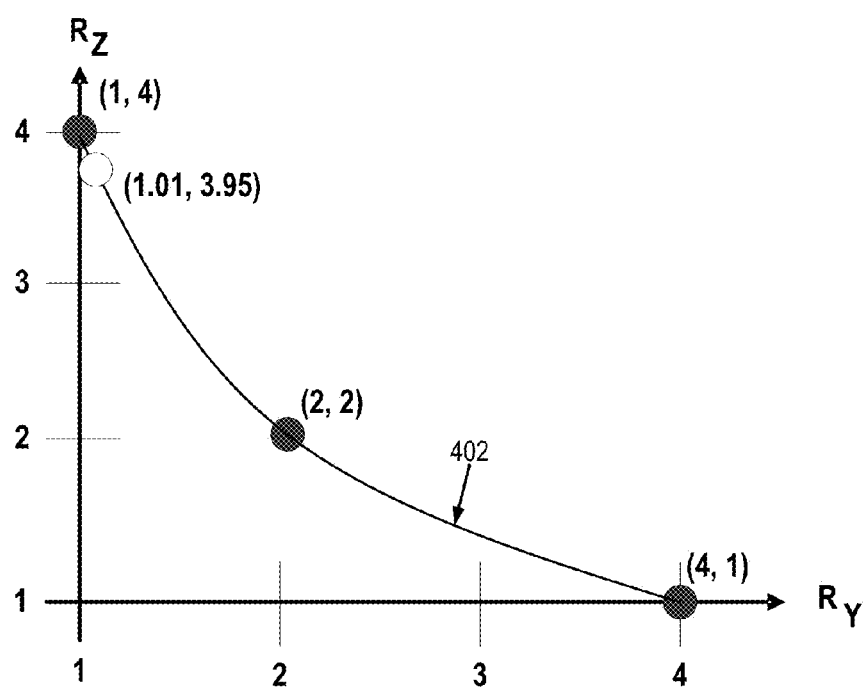
FIG. 4 is an example of a region of in-plane acceleration factor space in which the search for an optimal pair of in-plane acceleration factors may be performed.

An example of the optimization process is illustrated generally in FIG. 4. In this example, the curve 402 defines the portion of the selected region in $(R_1, R_2)$-space for which the net acceleration factor constraint R=4 is satisfied. The curve 402 has the end points (1,4) and (4,1), as shown. The optimization process may start, for example, at one of these endpoints and move towards the other. For instance, the metric may be calculated at the point (1,4). Then, the metric will be calculated at a point that is a certain small distance away from the initial point. For example, the metric may be calculated at the point (1.01, 3.95). This process continues for all desired points along the curve, and the maximum (or minimum) metric value is identified and the corresponding $(R_1, R_2)$ pair is stored for later use.

The optimization process that forms a part of the invention can be generalized. For instance, other optimization criteria can be identified, such as determining the largest overall net acceleration factor, R, possible for a maximum average g-factor, or the largest net acceleration factor, R, for a prescribed maximum number of overlapped or aliased points in the raw accelerated images. Similarly, the search in the $(R_1, R_2)$-space plane might be done over a region having some area as opposed to along a simple curve, such as curve 402 illustrated in FIG. 4.

Referring again to FIG. 2, the method of the present invention proceeds by generating a k-space sampling pattern using the estimated in-plane acceleration factors, as indicated at step 210. For example, a Cartesian grid of sample points may be generated such that the spacing of the sample points in the appropriate k-space plane is determined by the optimal pair of in-plane acceleration factors, $R_1$ and $R_2$. The MRI system is then operated to acquire k-space data by sampling k-space in accordance with the generated sampling pattern, as indicated at step 212. From the acquired k-space data, one or more images of the subject are reconstructed using the coil sensitivity maps and an appropriate parallel image reconstruction technique, such as SENSE.

Figure 5:
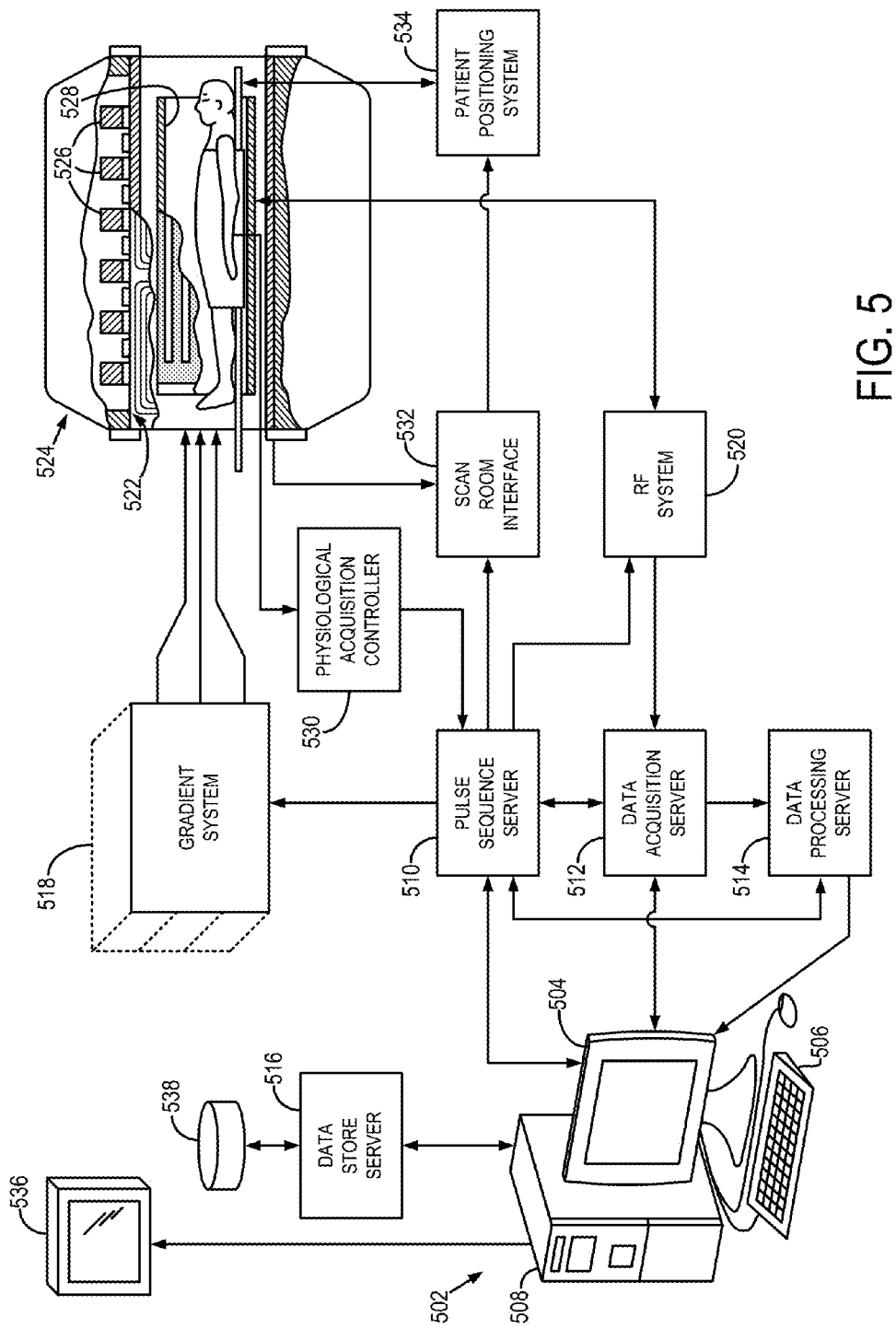
FIG. 5 is a block diagram of an example MRI system.

Referring particularly now to FIG. 5, an example of a magnetic resonance imaging ("MRI") system 500 is illustrated. The MRI system 500 includes a workstation 502 having a display 504 and a keyboard 506. The workstation 502 includes a processor 508, such as a commercially available programmable machine running a commercially available operating system. The workstation 502 provides the operator interface that enables scan prescriptions to be entered into the MRI system 500. The workstation 502 is coupled to four servers: a pulse sequence server 510; a data acquisition server 512; a data processing server 514; and a data store server 516. The workstation 502 and each server 510, 512, 514, and 516 are connected to communicate with each other.

The pulse sequence server 510 functions in response to instructions downloaded from the workstation 502 to operate a gradient system 518 and a radiofrequency ("RF") system 520. Gradient waveforms necessary to perform the prescribed scan are produced and applied to the gradient system 518, which excites gradient coils in an assembly 522 to produce the magnetic field gradients $G_x$, $G_y$, and $G_z$ used for position encoding MR signals. The gradient coil assembly 522 forms part of a magnet assembly 524 that includes a polarizing magnet 526 and a whole-body RF coil 528.

RF excitation waveforms are applied to the RF coil 528, or a separate local coil (not shown in FIG. 5), by the RF system 520 to perform the prescribed magnetic resonance pulse sequence. Responsive MR signals detected by the RF coil 528, or a separate local coil (not shown in FIG. 5), are received by the RF system 520, amplified, demodulated, filtered, and digitized under direction of commands produced by the pulse sequence server 510. The RF system 520 includes an RF transmitter for producing a wide variety of RF pulses used in MR pulse sequences. The RF transmitter is responsive to the scan prescription and direction from the pulse sequence server 510 to produce RF pulses of the desired frequency, phase, and pulse amplitude waveform. The generated RF pulses may be applied to the whole body RF coil 528 or to one or more local coils or coil arrays (not shown in FIG. 5).

The RF system 520 also includes one or more RF receiver channels. Each RF receiver channel includes an RF preamplifier that amplifies the MR signal received by the coil 528 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad (6);$$

and the phase of the received MR signal may also be determined:

$$\varphi = \tan^{-1}\left(\frac{Q}{I}\right). \qquad (7)$$

The pulse sequence server 510 also optionally receives patient data from a physiological acquisition controller 530. The controller 530 receives signals from a number of different sensors connected to the patient, such as electrocardiograph ("ECG") signals from electrodes, or respiratory signals from a bellows or other respiratory monitoring device. Such signals are typically used by the pulse sequence server 510 to synchronize, or "gate," the performance of the scan with the subject's heart beat or respiration.

The pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized MR signal samples produced by the RF system 520 are received by the data acquisition server 512. The data acquisition server 512 operates in response to instructions downloaded from the workstation 502 to receive the real-time MR data and provide buffer storage, such that no data is lost by data overrun. In some scans, the data acquisition server 512 does little more than pass the acquired MR data to the data processor server 514. However, in scans that require information derived from acquired MR data to control the further performance of the scan, the data acquisition server 512 is programmed to produce such information and convey it to the pulse sequence server 510. For example, during prescans, MR data is acquired and used to calibrate the pulse sequence performed by the pulse sequence server 510. Also, navigator signals may be acquired during a scan and used to adjust the operating parameters of the RF system 520 or the gradient system 518, or to control the view order in which k-space is sampled. In all these examples, the data acquisition server 512 acquires MR data and processes it in real-time to produce information that is used to control the scan.

The data processing server 514 receives MR data from the data acquisition server 512 and processes it in accordance with instructions downloaded from the workstation 502. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 514 are conveyed back to the workstation 502 where they are stored. Real-time images are stored in a data base memory cache (not shown in FIG. 5), from which they may be output to operator display 512 or a display 536 that is located near the magnet assembly 524 for use by attending physicians. Batch mode images or selected real time images are stored in a host database on disc storage 538. When such images have been reconstructed and transferred to storage, the data processing server 514 notifies the data store server 516 on the workstation 502. The workstation 502 may be used by an operator to archive the images, produce films, or send the images via a network to other facilities.

Thus, a method for determining the optimum acceleration for an MRI acquisition in which parallel acquisition is performed has been described.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for three-dimensional parallel magnetic resonance imaging (MRI) using an MRI system, the steps of the method comprising:
   a) selecting a criterion;
   b) estimating a first acceleration factor along a first phase-encoding direction and a second acceleration factor along a second phase-encoding direction such that the product of the first and second acceleration factors is substantially equal to a desired net acceleration factor and such that the selected criterion is optimized;
   c) generating a k-space sampling pattern using the estimated acceleration factors;
   d) directing the MRI system to acquire k-space data while sampling k-space in accordance with the generated k-space sampling pattern; and
   e) reconstructing an image from the acquired k-space data.

2. The method as recited in claim 1 in which the selected criterion is an image quality criterion defined by an image quality metric.

3. The method as recited in claim 2 in which the image quality metric is a maximum noise amplification.

4. The method as recited in claim 1 further comprising acquiring coil sensitivity maps using the MRI system and using the coil sensitivity maps in step e) to reconstruct the image.

5. The method as recited in claim 1 in which step b) includes determining the first and second acceleration factors that minimize the selected criterion.

6. The method as recited in claim 5 in which the selected criterion is a maximum noise amplification in a three-dimensional volume-of-interest.

7. The method as recited in claim 6 in which the maximum noise amplification is determined by a g-factor for the image reconstruction to be performed in step e).

8. The method as recited in claim 5 in which step b) includes:
    determining a set of possible combinations of the first and second acceleration factors whose product is substantially equal to the desired net acceleration factor; and
    determining the combination of the first and second acceleration factors that minimizes the selected criterion.

9. The method as recited in claim 8 further comprising acquiring coil sensitivity maps using the MRI system and analyzing the coil sensitivity maps in step b) to estimate values for the selected criterion for each combination of the first and second acceleration factors.

10. The method as recited in claim 1 in which the selected criterion is the net acceleration factor and step b) includes maximizing the net acceleration factor.

11. The method as recited in claim 1 in which the selected criterion is a parameter that indicates an amount of aliasing and step b) includes minimizing the parameter.

12. A magnetic resonance imaging (MRI) system, comprising:
    a magnet system configured to generate a polarizing magnetic field about at least a portion of a subject arranged in the MRI system;
    a plurality of gradient coils configured to apply a magnetic gradient field to the polarizing magnetic field;
    a radio frequency (RF) system including at least one RF coil configured to apply an RF field to the subject and a plurality of RF coils configured to receive magnetic resonance signals from the subject;
    a computer system programmed to:
        select a criterion;
        estimate a first acceleration factor along a first phase-encoding direction and a second acceleration factor along a second phase-encoding direction such that a product of the first and second acceleration factors is substantially equal to a desired net acceleration factor and such that the selected criterion is optimized;
        generate a k-space sampling pattern using the estimated acceleration factors;
        acquire k-space data by:
            directing the RF system to provide an RF excitation field to the subject;
            directing the RF system to receive magnetic resonance signals from the subject;
            directing the plurality of gradient coils to provide magnetic field gradients that spatially encode the received magnetic resonance signals in accordance with the generated k-space sampling pattern; and
        reconstruct an image from the acquired k-space data.

13. The MRI system as recited in claim 12 in which the computer system is programmed to select the criterion as an image quality criterion defined by an image quality metric.

14. The MRI system as recited in claim 13 in which the computer system is programmed to select the image quality metric as a maximum noise amplification.

15. The MRI system as recited in claim 12 in which the computer system is programmed to direct the RF system and the plurality of gradient coils to acquire data indicative of a receive sensitivity of the plurality of RF coils, to reconstruct therefrom coil sensitivity maps, and to reconstruct the image from the acquired k-space data using the coil sensitivity maps.

16. The MRI system as recited in claim 12 in which the computer system is programmed to determine the first and second acceleration factors that minimize the selected criterion.

17. The MRI system as recited in claim 16 in which the computer system is programmed to select the criterion as a maximum noise amplification in a three-dimensional volume-of-interest.

18. The MRI system as recited in claim 17 in which the computer system is programmed to determine the maximum noise amplification by a g-factor for an image reconstruction used to reconstruct the image from the acquired k-space data.

19. The MRI system as recited in claim 16 in which the computer system is programmed to:
    determine a set of possible combinations of the first and second acceleration factors whose product is substantially equal to the desired net acceleration factor; and
    determine the combination of the first and second acceleration factors that minimizes the selected criterion.

* * * * *